(12) United States Patent
Lee et al.

(10) Patent No.: US 12,218,274 B2
(45) Date of Patent: Feb. 4, 2025

(54) SEMICONDUCTOR LIGHT EMITTING DEVICE AND DISPLAY APPARATUS

(71) Applicant: SAMSUNG ELECTRONICS CO., LTD., Suwon-si (KR)

(72) Inventors: Donggun Lee, Hwaseong-si (KR); Gibum Kim, Yongin-si (KR); Joosung Kim, Seongnam-si (KR); Jonguk Seo, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 1086 days.

(21) Appl. No.: 17/032,332

(22) Filed: Sep. 25, 2020

(65) Prior Publication Data
US 2021/0242370 A1 Aug. 5, 2021

(30) Foreign Application Priority Data

Feb. 3, 2020 (KR) .................. 10-2020-0012463

(51) Int. Cl.
| | |
|---|---|
| H01L 33/24 | (2010.01) |
| H01L 25/16 | (2023.01) |
| H01L 33/00 | (2010.01) |
| H01L 33/16 | (2010.01) |
| H01L 33/32 | (2010.01) |
| H01L 33/38 | (2010.01) |

(52) U.S. Cl.
CPC ............ *H01L 33/24* (2013.01); *H01L 25/167* (2013.01); *H01L 33/0095* (2013.01); *H01L 33/16* (2013.01); *H01L 33/007* (2013.01); *H01L 33/0075* (2013.01); *H01L 33/0093* (2020.05); *H01L 33/32* (2013.01); *H01L 33/385* (2013.01)

(58) Field of Classification Search
CPC ... H01L 33/24; H01L 25/167; H01L 33/0095; H01L 33/16; H01L 33/0093; H01L 33/007; H01L 33/0075; H01L 33/32; H01L 33/385
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| (Continued) | | |

FOREIGN PATENT DOCUMENTS

JP 2011-114155 A 6/2011

*Primary Examiner* — Joshua Benitez Rosario
*Assistant Examiner* — Christopher A Culbert
(74) *Attorney, Agent, or Firm* — Fish & Richardson P.C.

(57) ABSTRACT

A semiconductor light emitting device includes a light emitting structure in the form of a rod, including a first conductivity-type semiconductor layer, an active layer and a second conductivity-type semiconductor layer, and having a first surface, a second surface opposing the first surface, and a side surface connecting the first and second surfaces; a regrowth semiconductor layer surrounding an entire side surface of the light emitting structure and having a first thickness in a first position along a perimeter of the side surface and a second thickness, different from the first thickness, in a second position along a perimeter of the side surface; a first electrode on the first surface of the light emitting structure and connected to the first conductivity-type semiconductor layer; and a second electrode on the second surface of the light emitting structure and connected to the second conductivity-type semiconductor layer.

20 Claims, 16 Drawing Sheets

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,183,072 B2 | 5/2012 | Seo et al. | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,112,112 B2 * | 8/2015 | Do | H01L 33/08 |
| 9,484,492 B2 | 11/2016 | Bour et al. | |
| 9,882,084 B2 | 1/2018 | Lee et al. | |
| 10,297,715 B2 | 5/2019 | Kaneda et al. | |
| 2015/0102365 A1 * | 4/2015 | Cha | H01L 33/18 |
| | | | 257/88 |
| 2017/0373228 A1 | 12/2017 | Chang et al. | |
| 2018/0374991 A1 | 12/2018 | Bour et al. | |

* cited by examiner

SEMICONDUCTOR LIGHT EMITTING DEVICE AND DISPLAY APPARATUS

CROSS-REFERENCE TO RELATED APPLICATION

Korean Patent Application No. 10-2020-0012463, filed on Feb. 3, 2020, in the Korean Intellectual Property Office, and entitled: "Semiconductor Light Emitting Device and Display Apparatus," is incorporated by reference herein in its entirety.

BACKGROUND

1. Field

The present disclosure relates to a semiconductor light emitting device and a display apparatus including the same.

2. Description of the Related Art

Semiconductor light emitting diodes (LEDs) have been used as light sources in various electronic products, as well as light sources in lighting devices. In particular, semiconductor LEDs are being widely used as light sources in various display apparatuses, e.g., televisions (TVs), mobile phones, personal computers (PCs), laptop PCs, and personal digital assistants (PDAs).

Existing display apparatuses include display panels, e.g., liquid crystal display (LCD) panels and backlights. Recently, however, display apparatuses, which use LEDs as pixels and thereby do not require an additional backlight, have been developed. Such display apparatuses may be made to be compact and may achieve high luminance with improved optical efficiency, e.g., as compared to conventional LCDs.

SUMMARY

According to example embodiments, a semiconductor light emitting device may include a light emitting structure in the form of a rod, including a first conductivity-type semiconductor layer, an active layer and a second conductivity-type semiconductor layer, and having a first surface provided by the first conductivity-type semiconductor layer, a second surface provided by the second conductivity-type semiconductor layer and opposing the first surface, and a side surface connecting the first and second surfaces and perpendicular to the first and second surfaces, a regrowth semiconductor layer surrounding an entire side surface of the light emitting structure and having a first thickness in a first position along a perimeter of the side surface and a second thickness, different from the first thickness, in a second position along a perimeter of the side surface, a first electrode disposed on the first surface of the light emitting structure and connected to the first conductivity-type semiconductor layer, and a second electrode disposed on the second surface of the light emitting structure and connected to the second conductivity-type semiconductor layer.

According to example embodiments, a semiconductor light emitting device may include a light emitting structure in the form of a rod, including a first conductivity-type semiconductor layer, an active layer and a second conductivity-type semiconductor layer, and having a first surface provided by the first conductivity-type semiconductor layer, a second surface provided by the second conductivity-type semiconductor layer and opposing the first surface, and a side surface connecting the first and second surfaces and perpendicular to the first and second surfaces, a regrowth semiconductor layer surrounding an entire side surface of the light emitting structure and having an external side surface formed of crystallographic planes, a first electrode disposed on the first surface of the light emitting structure and connected to the first conductivity-type semiconductor layer, and a second electrode disposed on the second surface of the light emitting structure and connected to the second conductivity-type semiconductor layer, wherein the side surface of the light emitting structure and the external side surface of the regrowth semiconductor layer have different shapes on a cross-section perpendicular to the side and external side surfaces.

According to example embodiments, a display apparatus may include first and second electrode parts in each of a plurality of pixel regions and spaced apart from each other, and a semiconductor light emitting device disposed between the first and second electrode parts.

According to example embodiments, a display apparatus may include a circuit board including driving circuits configured to drive pixel regions, a plurality of semiconductor light emitting devices spaced apart each other on the circuit board to form the pixel regions, a plurality of wavelength conversion parts disposed on first surfaces of the plurality of light emitting structures, and a partition wall surrounding side surfaces of the plurality of wavelength conversion parts and having a partitioning structure configured to separate the plurality of wavelength conversion parts, wherein each of the plurality of semiconductor light emitting devices may include a light emitting structure in the form of a rod, including a first conductivity-type semiconductor layer, an active layer and a second conductivity-type semiconductor layer, and having a first surface provided by the first conductivity-type semiconductor layer, a second surface provided by the second conductivity-type semiconductor layer and opposing the first surface, and a side surface connecting the first and second surfaces and perpendicular to the first and second surfaces, a regrowth semiconductor layer surrounding an entire side surface of the light emitting structure and having an external side surface formed of crystallographic planes, a first electrode disposed on the first surface of the light emitting structure and connected to the first conductivity-type semiconductor layer, and a second electrode disposed on the second surface of the light emitting structure and connected to the second conductivity-type semiconductor layer, wherein the side surface of the light emitting structure and the external side surface of the regrowth semiconductor layer have different shapes on a cross-section perpendicular to the side and external side surfaces.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, embodiments of the present disclosure will be described as follows with reference to the attached drawings.

Unless otherwise indicated, the spatially relative terms, "upper," "upper surface," "lower," "lower surface," "side surface," and the like, are used herein based on the drawings. It will be understood that the spatially relative terms are intended to encompass different orientations of the device in use or operation in addition to the orientation depicted in the figures.

Figure 1A:
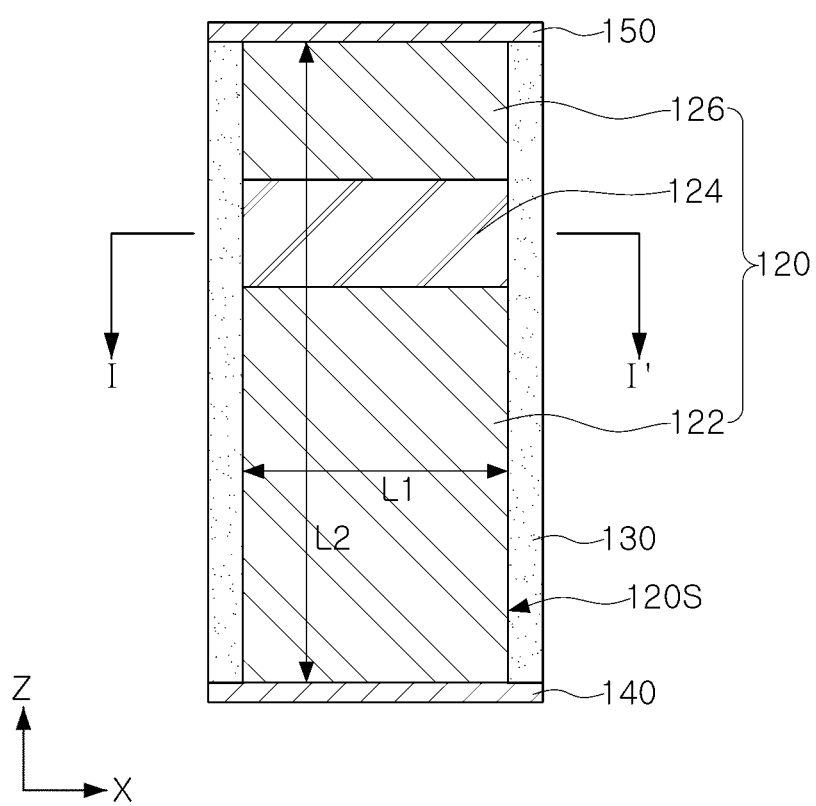
FIGS. 1A and 1B are cross-sectional views illustrating a semiconductor light emitting device according to example embodiments.
Figure 1B:
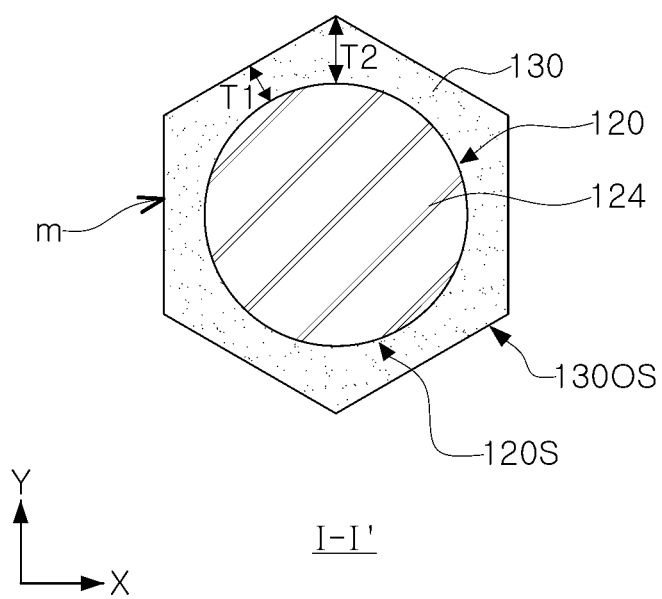

FIGS. 1A and 1B are cross-sectional views illustrating a semiconductor light emitting device according to example embodiments. FIG. 1B is a cross-section along line I-I' of FIG. 1A. It is noted that FIG. 1B is a top view of a surface cut along line I-I' of FIG. 1A.

Referring to FIGS. 1A and 1i, a semiconductor light emitting device 100 may include a light emitting structure 120, a regrowth semiconductor layer 130 surrounding a side surface of the light emitting structure 120, and first and second electrodes 140 and 150 disposed on both surfaces of the light emitting structure 120. The light emitting structure 120 may include a first conductivity-type semiconductor layer 122, an active layer 124, and a second conductivity-type semiconductor layer 126, which are sequentially stacked.

The light emitting structure 120 may have a first surface provided by the first conductivity-type semiconductor layer 122, a second surface provided by the second conductivity-type semiconductor layer 126 and opposing the first surface, and a side surface 120S connecting the first and second surfaces and perpendicular to the first and second surfaces. For example, referring to FIG. 1A, the first and second surfaces of the light emitting structure 120 may be spaced apart from each other along the Z direction. As illustrated in FIG. 1A, the light emitting structure 120 may have a diameter of a first length L1 in a first direction, e.g., as measured between facing portions of the side surface 120S in the X direction, and a height of a second length L2, longer than the first length L1, in a second direction, e.g., as measured between the first and second surfaces in the Z direction. For example, as illustrated in FIG. 1A, the first and second lengths L1 and L2 may be constant. When a cross-section of the light emitting structure 120 in the first direction is not circular, the first length L1 may be a maximum length. For example, the first length L1 may be in the range of about 0.2 μm to about 100 μm. An aspect ratio (L2/L1) of the second length L2 to the first length L1 may be in the range of about 2 to about 100. Due to the perpendicular side surface 120S and the high aspect ratio, the light emitting structure 120 may be advantageous in high integration when implementing a display apparatus using the semiconductor light emitting device 100.

In the light emitting structure 120, the cross-section in the first direction may be circular as illustrated in FIG. 1B. Accordingly, the side surface 120S of the light emitting structure 120 may be circular, e.g., the side surface 120S may have a circular cylindrical shape connecting the first and second surfaces. The side surface 120S of the light emitting structure 120 may be a plane, which cannot be defined as a particular crystallographic plane. That is, the side surface 120S of the light emitting structure 120 may not be a particular crystallographic plane of a semiconductor material forming the light emitting structure 120.

The first conductivity-type semiconductor layer 122, the active layer 124, and the second conductivity-type semiconductor layer 126 may be formed of a nitride semiconductor, while the light emitting structure 120 may be a nitride light emitting structure. The first and second conductivity-type semiconductor layers 122 and 126 may be nitride semiconductor layers having compositions of n-type or p-type $In_xAl_yGa_{1-x-y}N$ ($0 \leq x < 1$, $0 \leq y < 1$, $0 \leq x+y < 1$). For example, the first conductivity-type semiconductor layer 122 may be an n-type gallium nitride (n-GaN) layer doped with silicon (Si) or carbon (C), and the second conductivity-type semiconductor layer 126 may be a p-type gallium nitride (p-GaN) layer doped with magnesium (Mg) or zinc (Zn). According to example embodiments, however, the first and second conductivity-type semiconductor layers 122 and 126 may be formed of an aluminum gallium indium phosphide (AlInGaP) or aluminum gallium indium arsenide (AlInGaAs)-based semiconductor layer, in addition to a nitride semiconductor. Each of the first and second conductivity-type semiconductor layers 122 and 126 may be formed of a single layer, or may include a plurality of layers having different doping concentrations, compositions, or the like.

The active layer 124 may emit light having predetermined amount of energy by a recombination of electrons and holes. The active layer 124 may have a single quantum well (SQW) structure or a multiple quantum well (MQW) structure in which a quantum well layer and a quantum barrier layer are alternately disposed. For example, the quantum well layer and the quantum barrier layer may be $In_xAl_yGa_{1-x-y}N$ ($0 \leq x \leq 1$, $0 \leq y \leq 1$, $0 \leq x+y \leq 1$) layers having different compositions. For example, the quantum well layer may be an $In_xGa_{1-x}N$ ($0 < x \leq 1$) layer, while the quantum barrier layer may be a GaN layer or an AlGaN layer. Thicknesses of the quantum well layer and the quantum barrier layer may be in the range of about 1 nm to about 50 nm.

The regrowth semiconductor layer 130 may be disposed to surround the entire side surface 120S of the light emitting structure 120, as illustrated in FIG. 1B. Accordingly, the entire side surface 120S of the light emitting structure 120 may be covered by the regrowth semiconductor layer 130 without a region exposed through the regrowth semiconductor layer 130. The regrowth semiconductor layer 130 may have substantially the same length as the second length L2 in the length direction of the light emitting structure 120. The regrowth semiconductor layer 130 may be a layer epitaxially grown from the side surface 120S of the light emitting structure 120. The regrowth semiconductor layer 130 may be a nitride semiconductor layer having a composition of $In_xAl_yGa_{1-x-y}N$ ($0 \leq x < 1$, $0 \leq y < 1$, $0 \leq x+y < 1$). For example, the regrowth semiconductor layer 130 may have the same composition as at least a portion of the light emitting structure 120, but may be an undoped layer excluding a doped element. Accordingly, the regrowth semiconductor layer 130 may not have conductivity. For example, the regrowth semiconductor layer 130 may be an undoped GaN layer.

The regrowth semiconductor layer 130 may have a hexagonal shape in a top view, as illustrated in FIG. 1B. Accordingly, in the regrowth semiconductor layer 130, an inner side surface in contact with the light emitting structure 120 may be circular, correspondingly to, e.g., tracing, the shape of the side surface 120S of the light emitting structure 120, while an outer side surface 130OS may have a hexagonal shape. For example, referring to FIG. 1B, the inner side surface of the regrowth semiconductor layer 130, i.e., a surface in contact with the light emitting structure 120, may have a shape of a circular cylinder, and the outer side surface 130S of the regrowth semiconductor layer 130, i.e., a surface facing away from light emitting structure 120, may have a shape of a hexagonal cylinder. The side surface 120S of the light emitting structure 120 and the outer side surface 130OS of the regrowth semiconductor layer 130 may have shapes not corresponding in the cross-section in the first direction, i.e., the side surface 120S of the light emitting structure 120 and the outer side surface 130OS of the regrowth semiconductor layer 130 may have different shapes in a top view.

The regrowth semiconductor layer 130 may have a non-constant thickness along the side surface 120S of the light emitting structure 120, e.g., the regrowth semiconductor layer 130 may have a non-constant thickness along a radial direction extending from the side surface 120S of the light emitting structure 120. For example, as illustrated in FIG. 1B, the regrowth semiconductor layer 130 may have a first thickness T1 in a first position and a second thickness T2, greater than the first thickness T1, in a second position. Such a difference in the thicknesses may be a result of the shapes of the side surface 120S of the light emitting structure 120 and the outer side surface 130OS of the regrowth semiconductor layer 130, which do not correspond to each other, not a deviation of processes.

The outer side surface 130OS of the regrowth semiconductor layer 130 may be defined as crystallographically equivalent planes. For example, the outer side surface 130OS of the regrowth semiconductor layer 130 may be formed of m-planes represented by {1100} of a Wurtzite structure. In another example, the crystallographic planes forming the outer side surface 130OS of the regrowth semiconductor layer 130 may not be high Miller index crystallographic planes. As used herein, the expression "high Miller index crystallographic plane" may refer to a plane which meets the requirement of h>k>l>0 in the Miller index represented as {hkil}, indicating characteristics of a crystallographic plane, and in particular, may refer to a crystallographic plane, an integer multiple of a low Miller index, such as {0001}, {1-100}, {11-20}, or the like.

In the semiconductor light emitting device 100, as the light emitting structure 120 may be dry etched to have a perpendicular side surface 120S, e.g., an entirety of the side surface 120S may be perpendicular with respect to a bottom of the first conductivity-type semiconductor layers 122, while the regrowth semiconductor layer 130 covers the side surface 120S of the light emitting structure 120, damage, e.g., crystallographic defects of the light emitting structure 120 caused by etching, may be minimized. Further, since the outer side surface 130OS of the regrowth semiconductor layer 130, in contrast to the light emitting structure 120, is formed of crystallographically stable planes, surface leakage may be minimized.

The first and second electrodes 140 and 150 are respectively disposed on the first and second surfaces of the light emitting structure 120 to be in contact with the first and second conductivity-type semiconductor layers 122 and 126, respectively. The first and second electrodes 140 and 150 may be in contact with upper and lower surfaces, respectively, of the regrowth semiconductor layer 130 in addition to the light emitting structure 120.

The first and second electrodes 140 and 150 may be formed of a single layer or multilayers of a conductive material. For example, each of the first and second electrodes 140 and 150 may include at least one of gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), or alloys thereof. Depending on example embodiments, at least one of the first and second electrodes 140 or 150 may be a transparent electrode, e.g., formed of a transparent conductive oxide or a transparent conductive nitride, or may include graphene. For example, each of the first and second electrodes 140 and 150 may be at least one of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, or zinc magnesium oxide ($Zn_{1-x}Mg_xO$, $0 \leq x \leq 1$).

Figure 2:
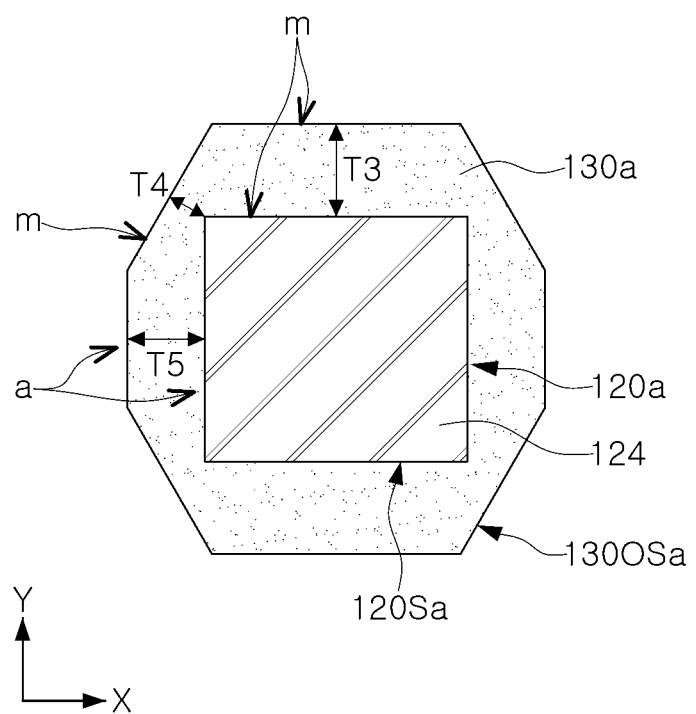
FIG. 2 is a cross-sectional view illustrating a semiconductor light emitting device according to example embodiments.

FIG. 2 is a cross-sectional view illustrating a semiconductor light emitting device according to example embodiments. FIG. 2 illustrates a cross-section corresponding to FIG. 1B.

Referring to FIG. 2, in a semiconductor light emitting device 100a, cross-sections of a light emitting structure 120a and a regrowth semiconductor layer 130a may have shapes different from those of the example embodiment of FIGS. 1A and 1B. The light emitting structure 120a may have a tetragonal cross-section and a tetragonal side surface 120S, as viewed in a top view. Accordingly, an outer side surface 130OSa of the regrowth semiconductor layer 130 may have an octagonal cross-section surrounding the light emitting structure 120a, as viewed in a top view. Further, the cross-sections of the side surface 120Sa of the light emitting structure 120a and the outer side surface 130OSa of the regrowth semiconductor layer 130a in a first direction, e.g., as viewed in a top view, may have different shapes.

The side surface 120Sa of the light emitting structure 120a may be formed of a-planes and m-planes of a hexagonal Wurtzite crystal structure. The outer side surface 130OSa of the regrowth semiconductor layer 130a may be formed of three pairs of m-planes and a pair of a-planes of a hexagonal Wurtzite crystal structure. The a-planes of the regrowth semiconductor layer 130a may be positioned parallel to those of the light emitting structure 120a.

The regrowth semiconductor layer 130a may have a non-constant thickness along the side surface 120Sa of the light emitting structure 120a. The regrowth semiconductor layer 130a has a third thickness T3 on the m-plane of the light emitting structure 120a, a fourth thickness T4, different from the third thickness T3, between the a-plane and the m-plane of the light emitting structure 120a, and a fifth thickness T5, different from the fourth thickness T4, on the a-plane of the light emitting structure 120a. The fifth thickness T5 may be different from the third thickness T3, but is not limited thereto.

Figure 3:
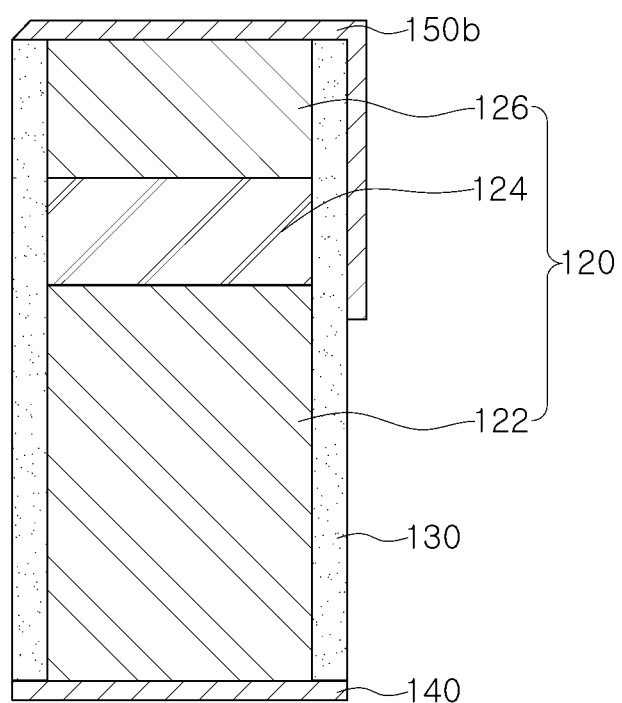
FIGS. 3 and 4 are cross-sectional views illustrating semiconductor light emitting devices according to example embodiments.
Figure 4:
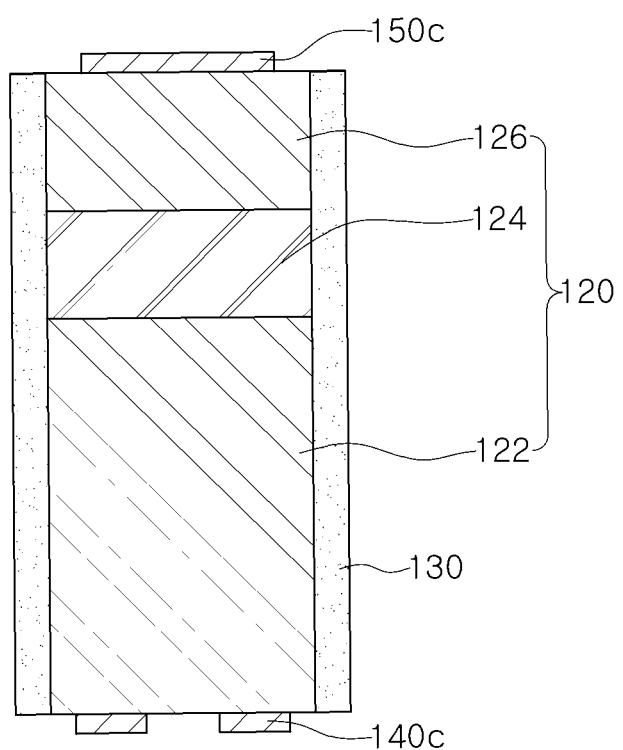

FIGS. 3 and 4 are cross-sectional views illustrating a semiconductor light emitting device according to example embodiments. FIGS. 3 and 4 illustrate cross-sections corresponding to FIG. 1A.

Referring to FIG. 3, a semiconductor light emitting device 100b may have a second electrode 150b having a different shape from that of the example embodiment of FIGS. 1A and 1B. The second electrode 150b may cover an upper surface of the second conductivity-type semiconductor layer 126 and at least a portion of an upper surface of the regrowth semiconductor layer 130, and may extend toward a lower portion of the regrowth semiconductor layer 130 along an outer side surface thereof so as to cover at least a portion of the outer side surface of the regrowth semiconductor layer 130. A lower end of the second electrode 150b may be located in various positions depending on example embodiments. Such a structure of the second electrode 150b may be formed by oblique angle deposition.

Referring to FIG. 4, a semiconductor light emitting device 100c may have a first electrode 140c and a second electrode 150c having a shape different from those of the example embodiment of FIGS. 1A and 1B. The first and second electrodes 140c and 150c may only be positioned on the first and second conductivity-type semiconductor layers 122 and 126, respectively, not to be in contact with the regrowth semiconductor layer 130. Further, the first electrode 140c may be spaced apart from a center of a lower surface of the first conductivity-type semiconductor layer 122 such that a region including the center is exposed downwardly. For example, the first electrode 140c may be disposed on the lower surface of the first conductivity-type semiconductor layer 122 in the form of a ring.

Depending on example embodiments, the first or second electrode 140c or 150c may be disposed to be in contact with the regrowth semiconductor layer 130, in combination with the example embodiments of FIG. 1A or 3.

Figure 5:
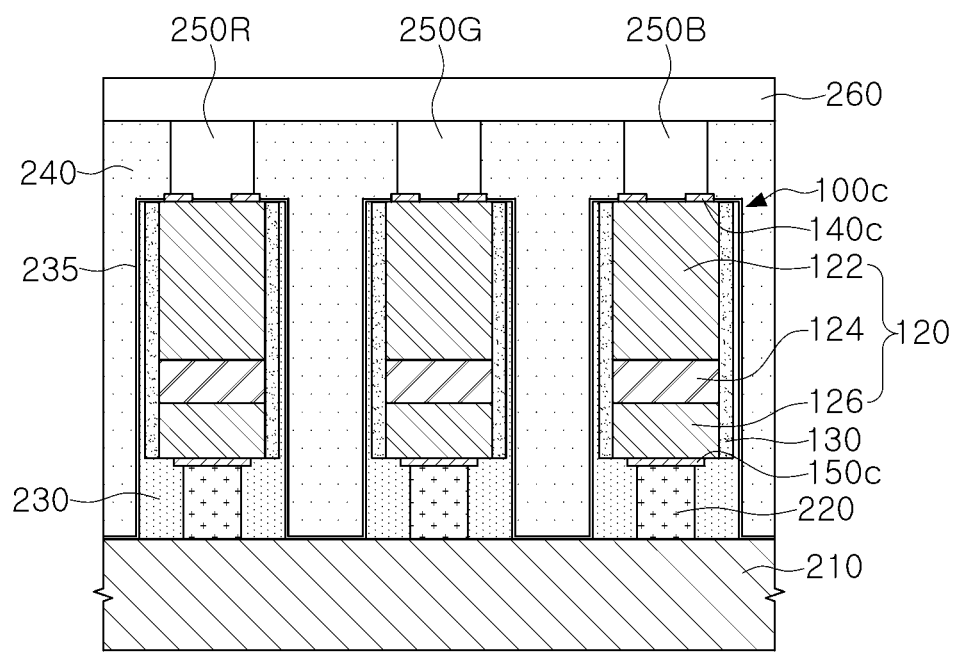
FIG. 5 is a cross-sectional view illustrating a display apparatus according to example embodiments.

FIG. 5 is a cross-sectional view illustrating a display apparatus according to example embodiments.

Referring to FIG. 5, a display apparatus 200 may include a circuit board 210, an electrode pad 220, a molding part 230, a passivation layer 235, a partition wall 240, wavelength conversion parts 250R, 250G and 250B, a protective layer 260, and the semiconductor light emitting devices 100c disposed in a unit pixel region in the form of a rod, e.g., each of the semiconductor light emitting devices 100c may extend as a rod between an electrode pad 220 and a corresponding wavelength conversion part as a single pixel unit. As for the semiconductor light emitting devices 100c, three unit pixel regions (e.g. three sub-pixels) form a single pixel region, and a region illustrated in FIG. 5 is repeatedly disposed to configure the display apparatus.

The circuit board 210 may include driving circuits including a plurality of thin film transistor (TFT) cells for driving the semiconductor light emitting devices 100c of the pixel region. The plurality of TFT cells may include semiconductor layers formed by implanting impurities onto the semiconductor substrate.

The electrode pad 220 may be disposed on the second electrode 150c of the semiconductor light emitting device 100c to electrically connect the second electrode 150c to the circuit board 210. The electrode pad 220 may be formed of, e.g., a metal, a semiconductor material, a transparent conductive material, or the like.

The molding part 230 may be disposed on the circuit board 210 to surround the semiconductor light emitting device 100c and the electrode pad 220. The molding part 230 may be formed of a material having low modulus such that a region including the semiconductor light emitting devices 100c is flexible. For example, the molding part 230 has lower modulus than the light emitting structure 120 and may be formed of a material having high tensile properties. For example, the molding part 230 may include any one of spin-on glass (SOG), polyimide (PI), polycyclohexylenedimethylene terephthalate (PCT), or epoxy molding compound (EMC). In example embodiments, the molding part 230 may include a light-reflective particle to reflect light. For example, titanium dioxide ($TiO_2$) or aluminum oxide ($Al_2O_3$) may be used as the light-reflective particle.

The passivation layer 235 may be disposed between the molding part 230 and the partition wall 240 and between the wavelength conversion parts 250R, 250G and 250B and the light emitting structures 120 on top of the light emitting structures 120. The passivation layer 235 may be formed of an insulating material and may include, e.g., a nitride or an oxide.

The partition wall 240 may have a partitioning structure separating the wavelength conversion parts 250R, 250G and 250B from each other while surrounding side surfaces thereof in an upper portion. Light emitted from the semiconductor light emitting devices 100c may be emitted through the wavelength conversion parts 250R, 250G and 250B without interfering with each other due to the partition wall 240. The partition wall 240, while being in contact with the first electrode 140c of the semiconductor light emitting device 100c, may be electrically connected to the first electrode 140c. The partition wall 240 extends toward a region between the semiconductor light emitting devices 100c to be closely disposed on the circuit board 210 in a lower portion. In example embodiments, the partition wall 240 may be physically and electrically connected to the circuit board 210 in at least one region. The partition wall 240 may include a metal, e.g., copper (Cu). In example embodiments, a reflective layer may further de disposed on an upper surface of the partition wall 240.

The wavelength conversion parts 250R, 250G and 250B may be regions in which a wavelength converting material, e.g., a quantum dot, while being dispersed in a liquid binder resin, is filled and cured in the partitioning structure of the partition wall 240. In example embodiments, when the semiconductor light emitting devices 100c emits blue light, the first wavelength conversion part 250R and the second wavelength conversion part 250G may include quantum dots capable of converting the blue light into red light and green light while the third wavelength conversion part 250B may include a binder resin only, without any quantum dot.

The protective layer 260 may be disposed on the wavelength conversion parts 250R, 250G and 250B, and prevents deterioration of the wavelength conversion parts 250R, 250G and 250B. Depending on example embodiments, the protective layer 260 may be omitted.

The semiconductor light emitting device 100c in the display apparatus 200 is illustrated as having the structure of the example embodiment of FIG. 4, but is not limited thereto. For example, the display apparatus 200 may include either of the semiconductor light emitting devices 100, 100a, and 100b of the example embodiments previously described with reference to FIGS. 1A to 3. In particular, the semiconductor light emitting devices 100c implemented in the display apparatus 200 may have a diameter of about 2 μm to about 100 μm and an aspect ratio of about 10 to about 100. Referring to FIGS. 1B and 2, the semiconductor light emitting device 100c may include the light emitting structure 120 (having a circular cross-section and a regrowth semiconductor layer 130a having a hexagonal outer side surface 130OS) or the light emitting structure 120a (having a tetragonal cross-section and a regrowth semiconductor layer 130a having an octagonal outer side surface 130OSa).

Figure 6A:
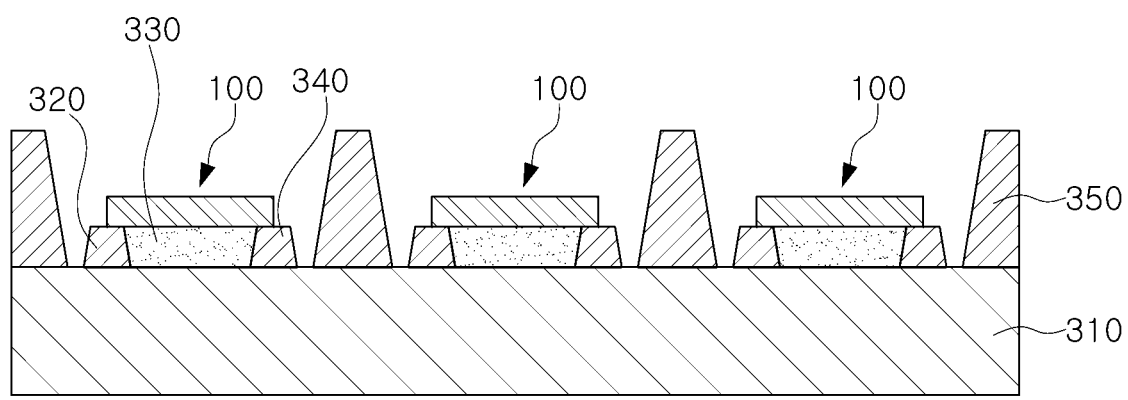
FIGS. 6A and 6B are respectively a cross-sectional view and a schematic diagram illustrating a display apparatus according to example embodiments.
Figure 6B:
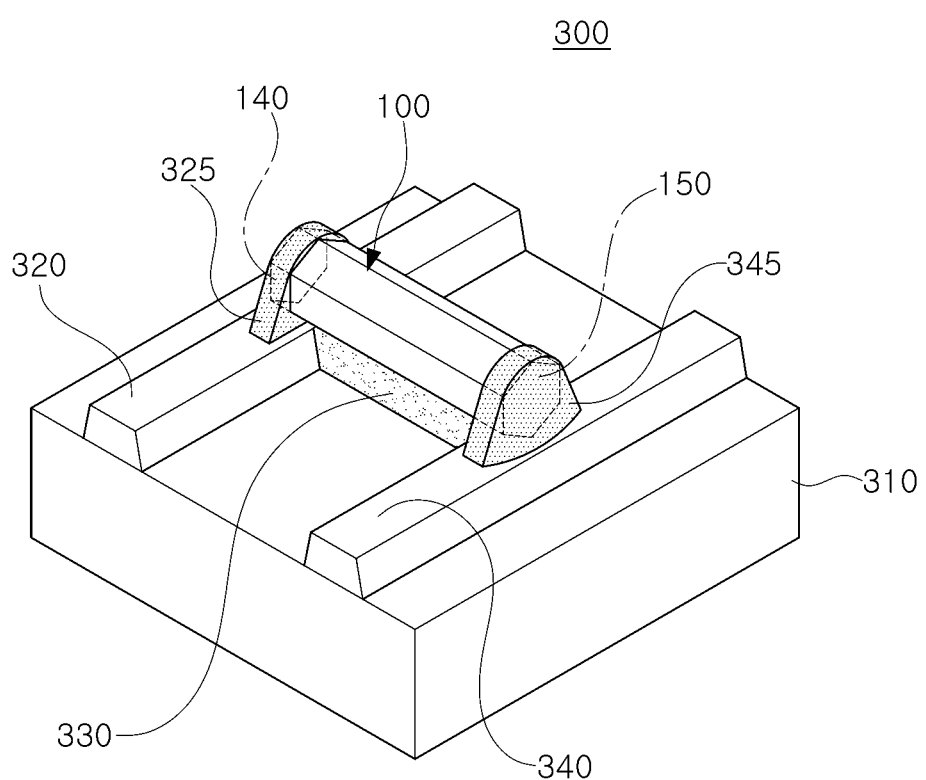

FIGS. 6A and 6B are respectively a cross-sectional view and a schematic perspective diagram illustrating a display apparatus according to example embodiments. FIG. 6B is an enlarged view of a single unit pixel region of FIG. 6A.

Referring to FIGS. 6A and 6B, a display apparatus 300 may include a circuit board 310, a first electrode part 320, a second electrode part 340, an insulating support part 330, an isolation part 350, and the semiconductor light emitting devices 100 disposed in respective unit pixel regions in the form of rods, e.g., one semiconductor light emitting device 100 may be disposed in one unit pixel region as a single rod. The semiconductor light emitting devices 100 are configured to emit red, green and blue lights such that three unit pixel regions, in which the semiconductor light emitting devices 100 are disposed, form a single pixel region.

The circuit board 310 may include driving circuits to drive the semiconductor light emitting devices 100 of the pixel regions. Depending on example embodiments, a reflective layer may further be disposed on the circuit board 310. In this case, the reflective layer may be formed separately from or may be integrally formed with the driving circuits in the circuit board 310.

The first and second electrode parts 320 and 340 may be disposed to be electrically connected to the first and second electrodes 140 and 150 of the semiconductor light emitting device 100. As illustrated in FIG. 6B, the first and second electrodes 140 and 150 of the semiconductor light emitting device 100 may be connected to the first and second electrode parts 320 and 340 by first and second electrode connection parts 325 and 345. In example embodiments, however, shapes of the first and second electrode parts 320 and 340 and the first and second electrode connection parts 325 and 345 may vary and the first electrode connection part 325 and/or second electrode connection part 345 may be omitted. The first and second electrode parts 320 and 340 and the first and second electrode connection parts 325 and 345 may be formed of, e.g., a metal, a semiconductor material, a transparent conductive material, or the like.

The insulating support part 330 is disposed between the first and second electrode parts 320 and 340 and can support and fix the semiconductor light emitting device 100. The insulating support part 330 may be formed of, e.g., an insulating material such as a resin.

The isolation part 350 may be disposed to isolate the unit pixel regions. For example, the isolation part 350 may be disposed to surround the unit pixel region in the form of a tetragon, but is not limited thereto.

The semiconductor light emitting devices 100 may have a length allowing the semiconductor light emitting devices 100 to be arranged between the first and second electrode parts 320 and 340. The semiconductor light emitting devices 100 are self-aligned between the first and second electrode parts 320 and 340 using an electric bias, and may be fixed by the insulating support part 330. The semiconductor light emitting devices 100 are illustrated as having the structure of the example embodiments of FIGS. 1A and 1B, but are not limited thereto. The semiconductor light emitting devices 100a to 100c of the example embodiments previously described with reference to FIGS. 2 to 4 may be implemented in the display apparatus 300. In particular, the semiconductor light emitting devices 100 implemented in the display apparatus 300 may have a diameter of about 0.2 μm to about 2 μm and an aspect ratio of about 2 to about 10. Further, as illustrated in FIG. 1B, the semiconductor light emitting devices 100 may include the light emitting structure 120 having a circular cross-section and a regrowth semiconductor layer 130 having a hexagonal outer side surface 130OS.

FIGS. 7A to 7J are cross-sectional views illustrating stages in a method of manufacturing the semiconductor light emitting device 100 of FIG. 1A.

Figure 7A:
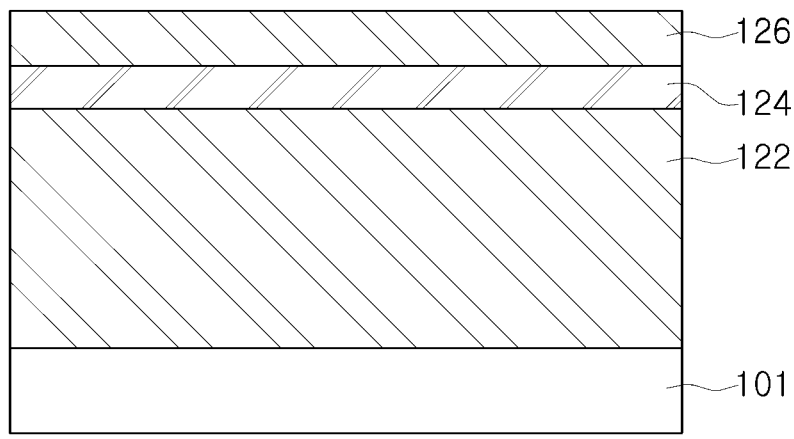
FIGS. 7A to 7J are cross-sectional views illustrating stages in a method of manufacturing the semiconductor light emitting device of FIG. 1.

Referring to FIG. 7A, the first conductivity-type semiconductor layer 122, the active layer 124, and the second conductivity-type semiconductor layer 126 are sequentially formed on a substrate 101.

The substrate 101 may be for growth of a nitride single crystal and may include an insulating material, a conductive material, or a semiconductor material. The substrate 101 may include, e.g., at least one of sapphire, Si, SiC, $MgAl_2O_4$, MgO, $LiAlO_2$, $LiGaO_2$, or GaN. Depending on example embodiments, a buffer layer may further be formed on the substrate 101 before the first conductivity-type semiconductor layer 122 is formed. In this case, the buffer layer is to alleviate lattice defects of the first conductivity-type semiconductor layer 122 and may include an undoped nitride semiconductor, e.g., undoped GaN, undoped AlN, and undoped InGaN.

The first conductivity-type semiconductor layer 122, the active layer 124, and the second conductivity-type semiconductor layer 126 may be formed by metal organic chemical vapor deposition (MOCVD) or molecular beam epitaxy (MBE). The first conductivity-type semiconductor layer 122 may be an n-type nitride semiconductor layer, e.g., n-type GaN, while the second conductivity-type semiconductor layer 126 may be a p-type nitride semiconductor layer, e.g., p-type GaN/p-type AlGaN. The active layer 124 may have a multiple quantum-well structure.

Figure 7B:
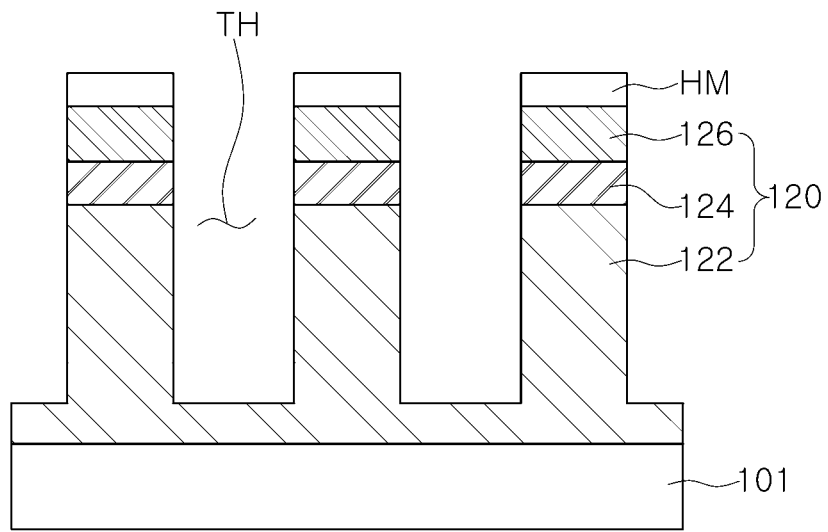

Referring to FIG. 7B, the stacked structure of the first conductivity-type semiconductor layer 122, the active layer 124, and the second conductivity-type semiconductor layer 126 may be etched to form light emitting structures 120 in the form of a rod (e.g., each rod may correspond to one light emitting structure 120). For example, as illustrated in FIG. 7B, the stacked structure of the first conductivity-type semiconductor layer 122, the active layer 124, and the second conductivity-type semiconductor layer 126 may be etched to form a plurality of rods extending upwardly from, e.g., perpendicularly with respect to, the substrate 101, and spaced apart from each other along a horizontal direction, i.e., a direction parallel to an upper surface of the substrate 101.

The light emitting structures 120 may be formed by etching the second conductivity-type semiconductor layer 126 and the active layer 124 from the top using a hard mask layer HM, followed by etching the first conductivity-type semiconductor layer 122 up to a certain height to form etched regions TH. The hard mask layer HM may be, e.g., an oxide layer. The light emitting structure 120 may be formed by a dry etching process, e.g., an inductively coupled plasma reactive ion etching (ICP-RIE).

In the present process, the light emitting structures 120 may be formed to have a circular or tetragonal shape in a top cross-sectional view (as illustrated in FIG. 1B or FIG. 2), according to a pattern, i.e., shape, of the hard mask layer HM. Further, the light emitting structures 120, as formed by the dry etching process, may be substantially formed to have a side surface perpendicular to an upper surface of the substrate 101.

Figure 7C:
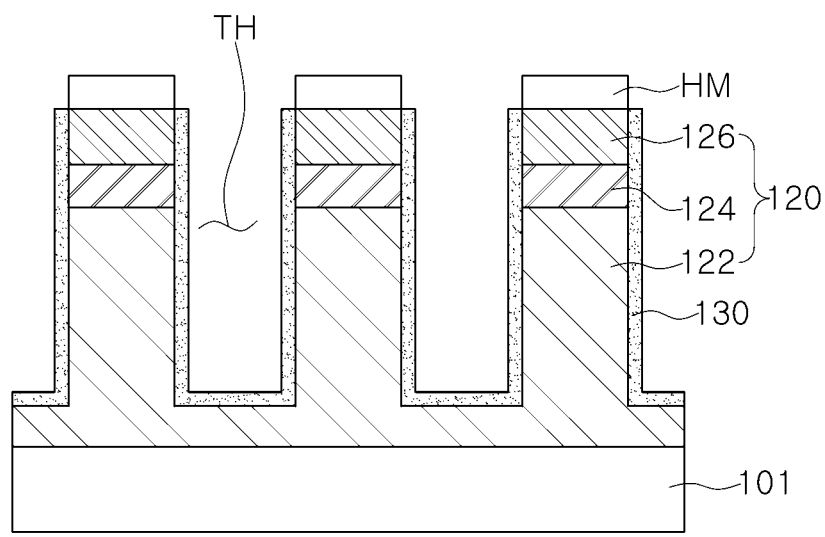

Referring to FIG. 7C, the regrowth semiconductor layer 130 may be formed on a surface of the light emitting structures 120. For example, as illustrated in FIG. 7C, the regrowth semiconductor layer 130 may be conformal on, e.g., the entirety of, the exposed surfaces of the light emitting structures 120 and regions therebetween.

In detail, the regrowth semiconductor layer 130 may be formed by epitaxial growth from an entire surface of the light emitting structures 120. Accordingly, the regrowth semiconductor layer 130 may be formed not only, e.g., directly, on the side surface of the light emitting structure 120 but also, e.g., directly, on an upper surface of the first conductivity-type semiconductor layer 122 exposed between the light emitting structures 120. However, the region formed on the upper surface of the first conductivity-type semiconductor layer 122 may be removed in a subsequent process. As an upper surface of the second conductivity-type semiconductor layer 126 is covered by the hard mask layer HM, the regrowth semiconductor layer 130 may not grow on the upper surface of the second conductivity-type semiconductor layer 126.

The regrowth semiconductor layer 130 may include a nitride semiconductor material having a composition equal or similar to that of the light emitting structures 120. The regrowth semiconductor layer 130, however, may be an undoped layer excluding a doped element and thus may not have conductivity. For example, the regrowth semiconductor layer 130 may be an undoped GaN layer. The regrowth semiconductor layer 130, as illustrated in FIG. 1B or 2, may grow to have a hexagonal or octagonal outer side surface on a top cross-section (i.e., as viewed in a top view). The outer side surface of the regrowth semiconductor layer 130 may be a crystallographic plane, e.g., a crystallographically stable plane. Accordingly, while the light emitting structures 120 may be patterned in a desired shape regardless of the crystallographic plane, crystal defects caused during formation of the light emitting structures 120 may be recovered, e.g., repaired, by the regrowth semiconductor layer 130. In addition, as the regrowth semiconductor layer 130 has the outer side surface that is a crystallographic plane, e.g., a single equivalent crystallographic plane, surface leakage current may be minimized.

Figure 7D:
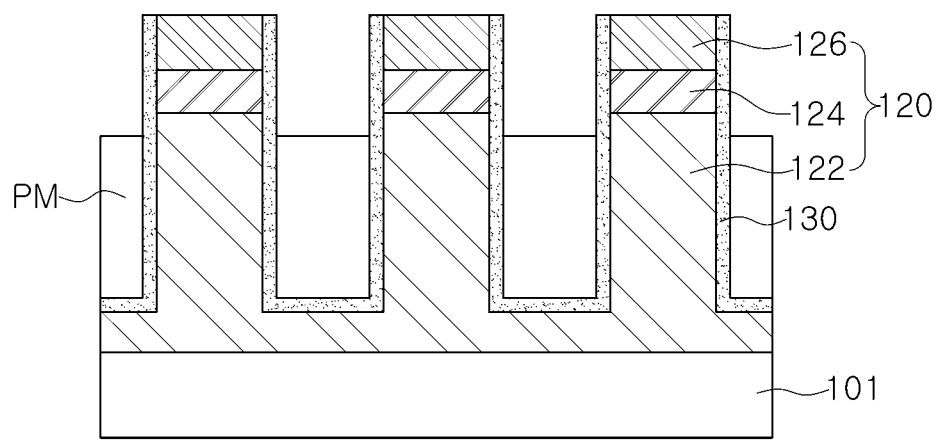

Referring to FIG. 7D, the hard mask layer HM may be removed, and an electrode mask layer PM filling a portion of the etched region TH may be formed.

First, the hard mask layer HM may be selectively removed by, e.g., a wet etching process. The electrode mask layer PM may then be formed to fill the etched region TH up to a predetermined height between adjacent ones of the light emitting structures 120. Depending on example embodiments, the electrode mask layer PM may be a photomask layer or a thermosetting layer, e.g., a spin-on-glass (SOG) layer, or the like. The height of the electrode mask layer PM may vary according to example embodiments.

Figure 7E:
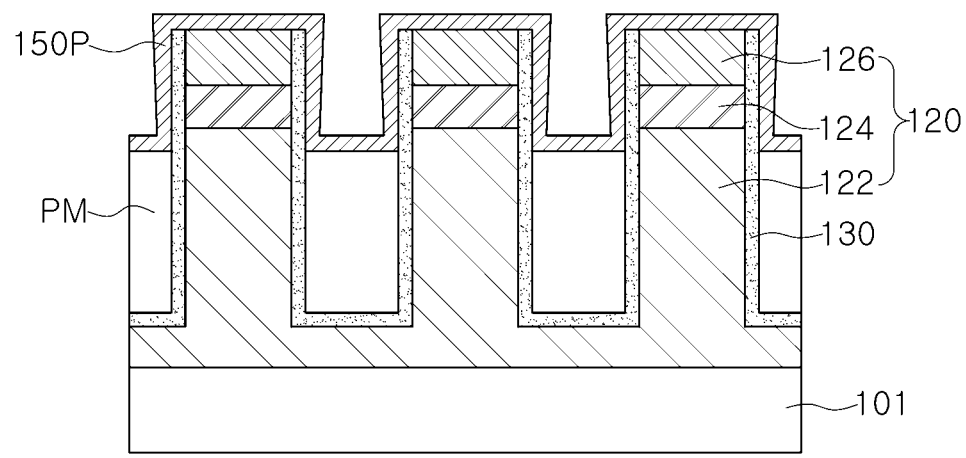

Referring to FIG. 7E, a preliminary second electrode layer 150P may be formed in a region exposed through the electrode mask layer PM.

The preliminary second electrode layer 150P may be formed by a deposition process. The preliminary second electrode layer 150P may be formed on an upper surface of the second conductivity-type semiconductor layer 126 and along the side surface of the light emitting structure 120 exposed by, e.g., extending above, the electrode mask layer PM. Due to a depositing material vertically delivered from the top, the preliminary second electrode layer 150P is formed to be relatively thick on upper surfaces of the second conductivity-type semiconductor layer 126 and the electrode mask layer PM, and is formed to be relatively thin on the side surface of the light emitting structure 120. The preliminary second electrode layer 150P may be a transparent conductive material, e.g., ITO.

In the case of the example embodiment of FIG. 3, the preliminary second electrode layer 150P, as formed by oblique angle deposition during the present process, is formed to be relatively thick on one side of the light emitting structure 120 in addition to the upper surface of the second conductivity-type semiconductor layer 126 (e.g., to form the L-shaped second electrode 150b in FIG. 3).

Figure 7F:
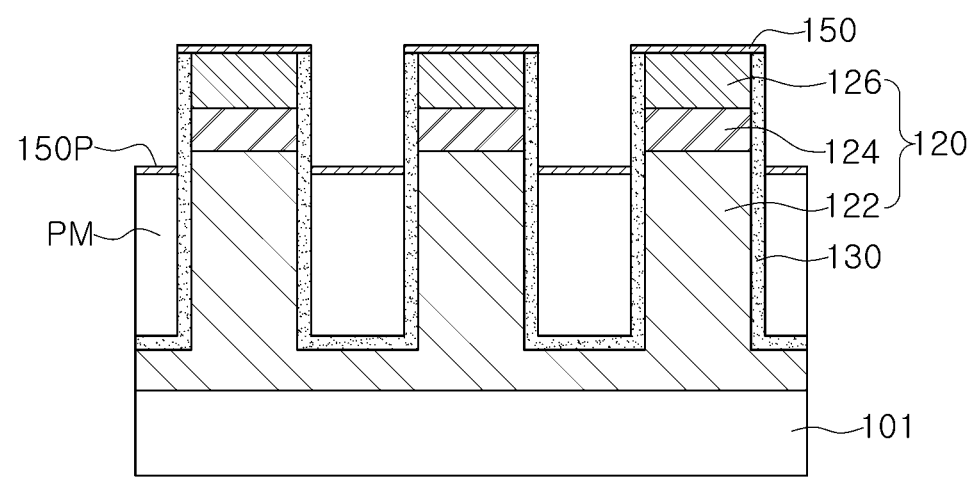

Referring to FIG. 7F, the second electrode 150 may be formed by partially removing the preliminary second electrode 150P.

The preliminary second electrode layer 150P may be removed using, e.g., a wet etching process, by a predetermined thickness. This may result in that the preliminary second electrode 150P remains on the upper surfaces of the second conductivity-type semiconductor layer 126 and the electrode mask layer PM, and the second electrode 150 covering the upper surface of the second conductivity-type semiconductor layer 126 may be formed. The second electrode 150 may be formed at a periphery of the upper surface of the second conductivity-type semiconductor layer 126 to cover the upper surface of the regrowth semiconductor layer 130 as well.

Figure 7G:
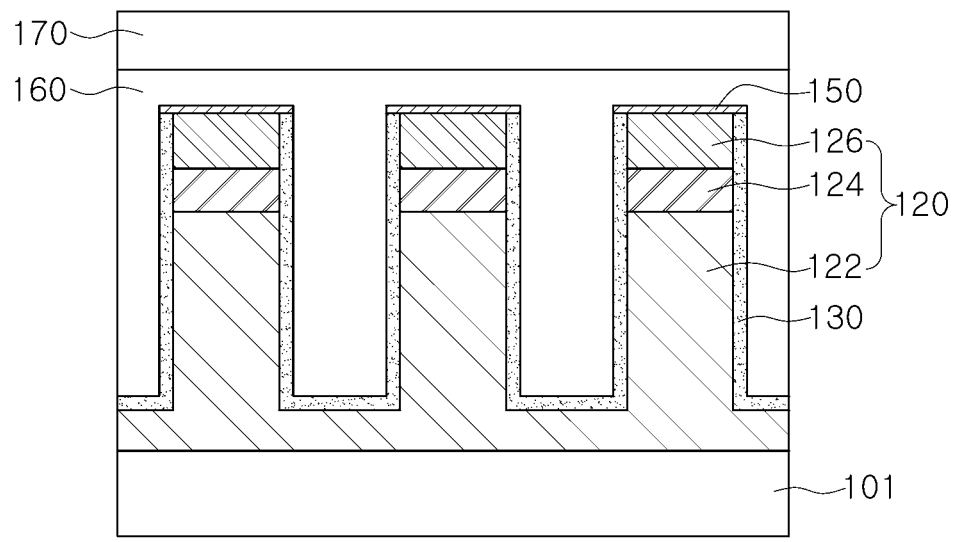

Referring to FIG. 7G, the electrode mask layer PM may be removed, and an adhesive layer 160 and a support substrate 170 may be formed.

For example, the electrode mask layer PM may be selectively removed by a lift-off process, which may serve to remove the preliminary second electrode layer 150P remaining on the electrode mask layer PM.

The support substrate 170 may be attached to an upper portion of the light emitting structures 120 using the adhesive layer 160. The adhesive layer 160 may be formed to fill regions on the upper portion of the light emitting structures 120 and between the light emitting structures 120. The adhesive layer 160 may be, e.g., a thermosetting resin material, but is not limited thereto. The support substrate 170 may be attached onto a side of the light emitting structures 120 opposite to the side on which the substrate 101 is disposed. The support substrate 170 may be, e.g., a glass substrate.

Figure 7H:
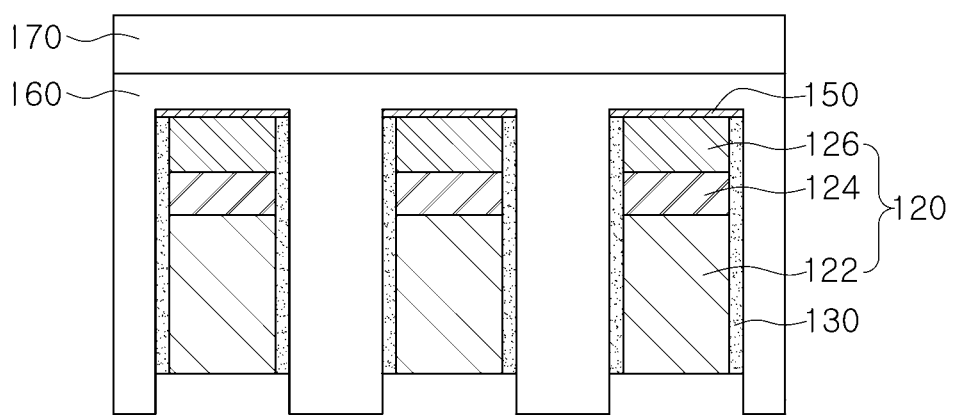

Referring to FIG. 7H, the substrate 101 may be removed, and the first conductivity-type semiconductor layer 122 and the regrowth semiconductor layer 130 may be partially removed.

The first conductivity-type semiconductor layer 122 may be removed by a predetermined height from an exposed lower surface after the substrate 101 is removed. The regrowth semiconductor layer 130 also may be partially removed from the lower surface together with the first conductivity-type semiconductor layer 122. The removal may be performed by a wet etching process or a dry etching process. This process serves to complete separation of the light emitting structures 120 from each other.

Figure 7I:
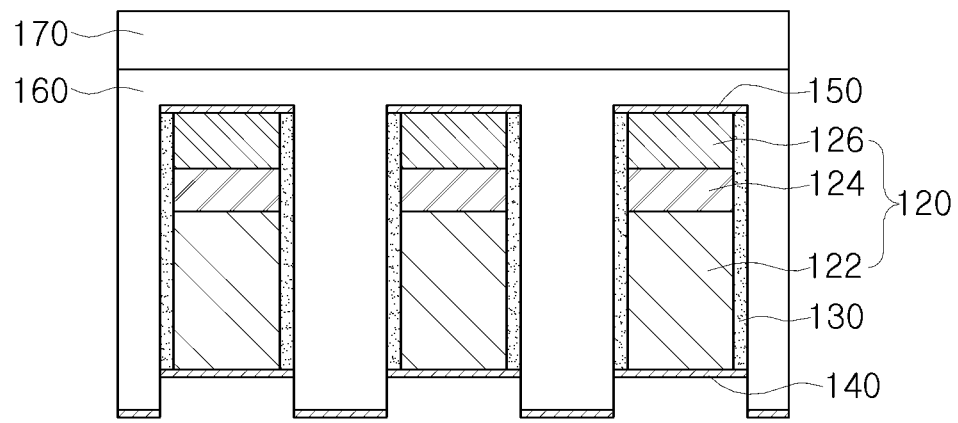

Referring to FIG. 7I, the first electrode 140 may be formed.

The first electrode 140 may be formed by a deposition process. The first electrode 140 may be formed on the lower surface of the first conductivity-type semiconductor layer 122 exposed from the adhesive layer 160. The first electrode 140 may be formed at a periphery of the lower surface of the first conductivity-type semiconductor layer 122 to cover the lower surface of the regrowth semiconductor layer 130 as well.

Figure 7J:
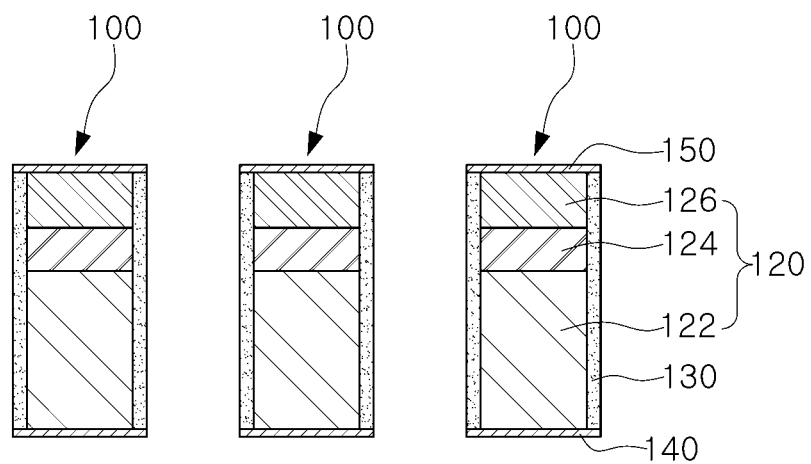

Referring to FIG. 7J, the adhesive layer 160 and the support substrate 170 may be removed. The adhesive layer 160 may be removed by, e.g., the wet etching process, and this may lead to removal of the support substrate 170 as well. This ultimately serves to manufacture a plurality of semiconductor light emitting devices 100, which are isolated from each other.

FIGS. 8A to 8G are cross-sectional views illustrating stages in a method of manufacturing the display apparatus 200.

Figure 8A:
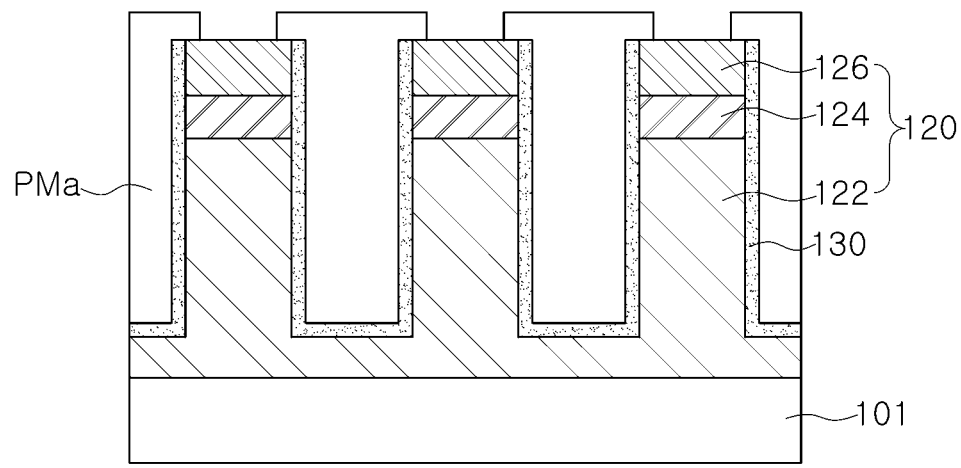
FIGS. 8A to 8G are cross-sectional views illustrating stages in a method of manufacturing a display apparatus according to example embodiments.

Referring to FIG. 8A, the light emitting structures 120 may be formed on the substrate 101, and an electrode mask layer PMa may be formed to fill between the light emitting structures 120. The light emitting structures 120 may be formed in the same manner previously described with reference to FIGS. 7A to 7C, and the hard mask layer HM (see FIG. 7C) may be removed.

The electrode mask layer PMa may then be formed to fill the etched region TH (see FIG. 7C) between the light emitting structures 120 and have an upper surface higher than those of the light emitting structures 120. The electrode mask layer PMa may be formed such that at least a portion of the second conductivity-type semiconductor layer 126 is exposed. Depending on example embodiments, the electrode mask layer PMa may be formed to partially expose the regrowth semiconductor layer 130 as well.

Figure 8B:
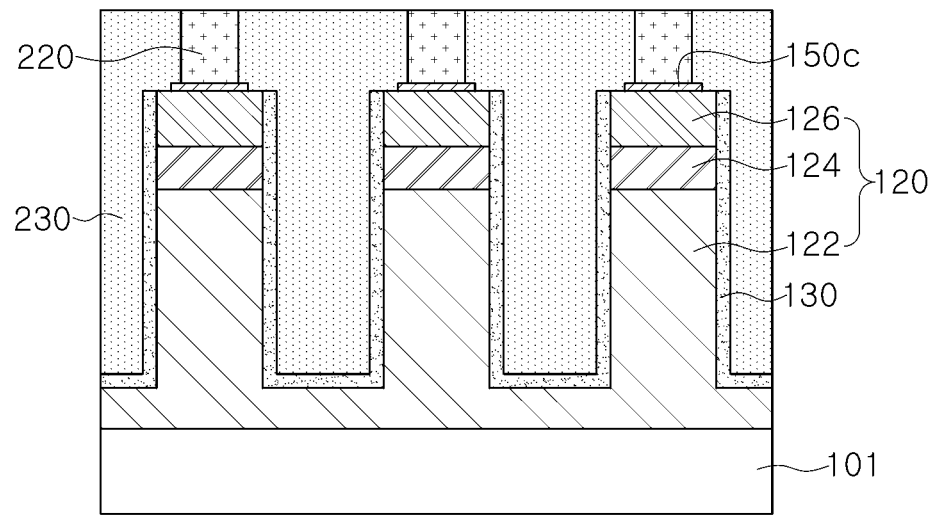

Referring to FIG. 8B, a second electrode 150c may be formed on the upper surface of the second conductivity-type semiconductor layer 126 exposed from the electrode mask layer PMa, and the electrode mask layer PMa may be removed followed by forming the molding part 230. Then, the electrode pads 220 may be formed.

The second electrode 150c may first be formed on the upper surface of the second conductivity-type semiconductor layer 126 by a deposition process. The electrode mask layer PMa may be selectively removed by a lift-off process.

The molding part 230 may then be placed higher than the upper surface of the second electrode 150c such that the second electrode 150c is covered. The molding part 230 may be formed of, e.g., SOG, but is not limited thereto. The molding part 230 is then patterned by lithography process, and the electrode pads 220 may be formed in the patterned region. The electrode pads 220 may be formed by, e.g., an electroplating method. The upper surface of the electrode pads 220 and the molding part 230 may be formed to have a flat surface by a planarization process, e.g., chemical mechanical polishing (CMP) process.

Figure 8C:
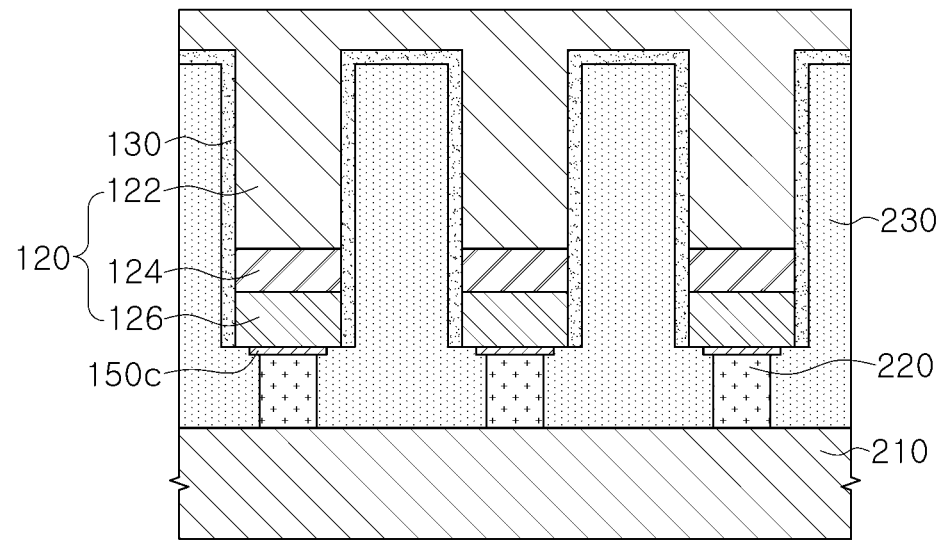

Referring to FIG. 8C, the circuit board 210 may be attached to the molding part 230 and the electrode pads 220, followed by removing the substrate 101. In FIG. 8C and the subsequent drawings, a structure including the light emitting structures 120 of FIG. 8B is illustrated upside down.

First, the circuit board 210 may be attached to the illustrated lower surface of the electrode pads 220 and the molding part 230. The circuit board 210 may include TFTs electrically connected to the light emitting structure 120. The circuit board 210 may be attached to the structure including the light emitting structures 120 by an additional bonding layer. The bonding layer may include an insulating bonding region and a conductive bonding region. Due to the conductive bonding region, the light emitting structures 120 may be electrically connected to the TFTs.

Once the circuit board 210 is attached, the substrate 101 may be removed from the top.

Figure 8D:
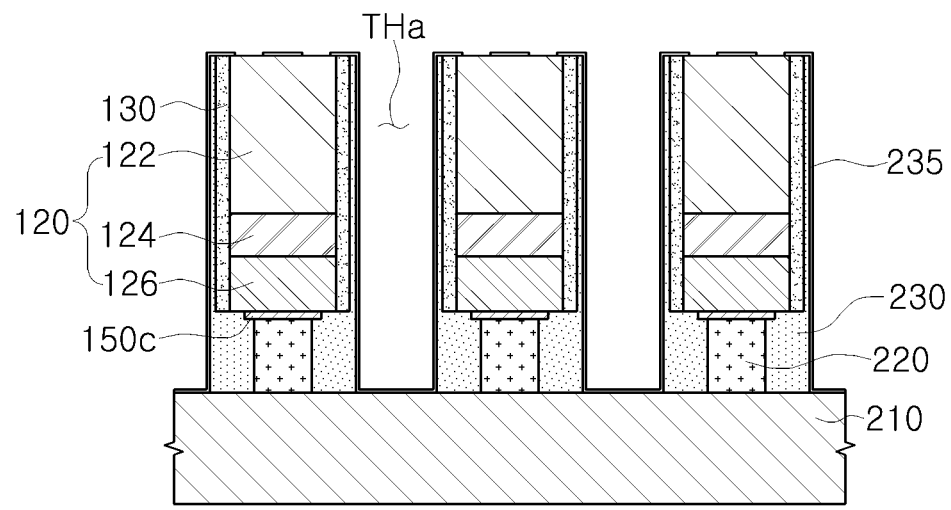

Referring to FIG. 8D, the first conductivity-type semiconductor layer 122 and the regrowth semiconductor layer 130 may be partially removed followed by partially removing the molding part 230 to form the passivation layer 235.

First, the first conductivity-type semiconductor layer 122 may be removed by a predetermined height from the exposed upper surface after the substrate 101 is removed. The regrowth semiconductor layer 130 may also be partially removed from the upper surface together with the first conductivity-type semiconductor layer 122. The removal may be performed by a wet etching process or a dry etching process. This process may completely separate the light emitting structures 120 and expose the molding part 230 upwardly.

The molding part 230 may then be partially removed between the light emitting structures 120 from the exposed upper surface to the upper surface of the circuit board 210. The removal may be performed by a wet etching process or a dry etching process. This may lead to formation of etched regions THa between the light emitting structures 120.

The passivation layer 235 may be formed on a portion of the upper surface of the regrowth semiconductor layer 130 and the first conductivity-type semiconductor layer 122 and a bottom surfaces and inner side surfaces of the etched regions THa. The passivation layer 235 may include an insulating material. The passivation layer 235 may be formed uniformly using a deposition process and may be removed in the form of a ring on the upper surface of the first conductivity-type semiconductor layer 122.

Figure 8E:
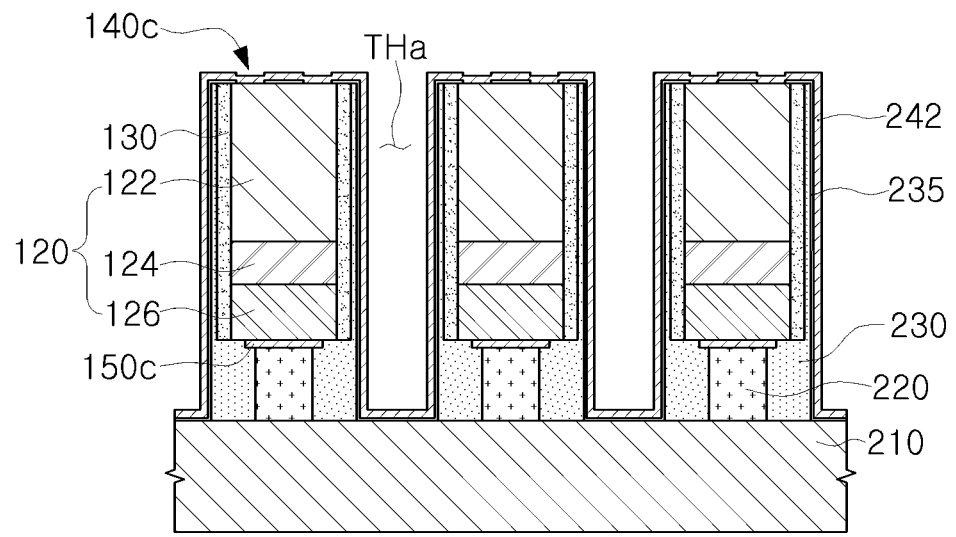

Referring to FIG. 8E, an electrode layer 242 connected to the first conductivity-type semiconductor layer 122 may be formed to form a first electrode 140c.

The electrode layer 242 may be deposited uniformly on the passivation layer 235. The electrode layer 242 may be formed on the bottom surfaces and the inner side surfaces of the etched regions THa along the passivation layer 235, and on the upper surface of the first conductivity-type semiconductor layer 122 on top of the light emitting structures 120. A region of the electrode layer 242, which is in contact with the first conductivity-type semiconductor layer 122, may form the first electrode 140c.

Figure 8F:
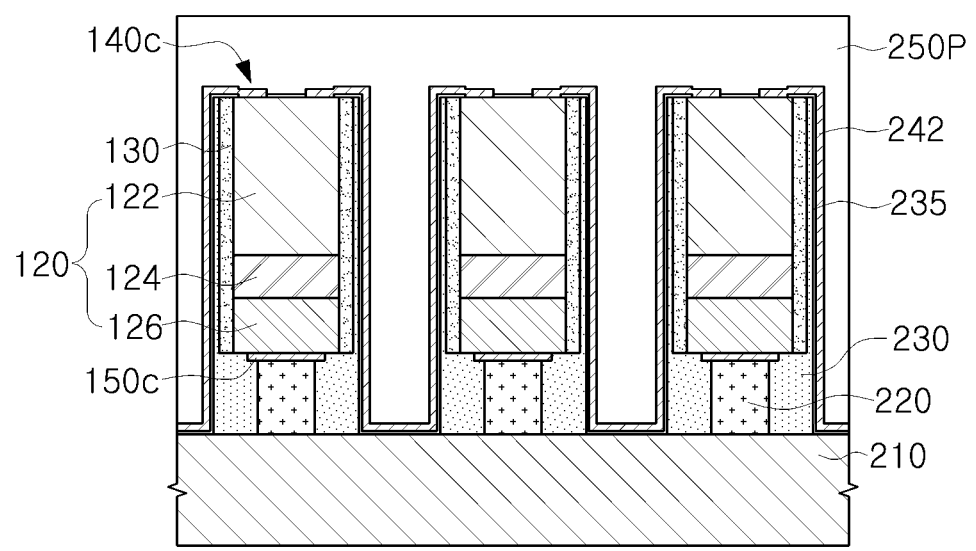

Referring to FIG. 8F, the electrode layer 242 may be partially removed, and a preliminary wavelength converting layer 250P filling the etched regions THa may be formed.

First, the electrode layer 242 may be removed from a region including a center of the upper surface of the first conductivity-type semiconductor layer 122 by a lithography process. Such removal may serve to dispose only the passivation layer 235 at a center of the upper surface of the first conductivity-type semiconductor layer 122, while the electrode layer 242 remains in a region forming the first electrode 140c and an outer side region thereof.

The preliminary wavelength converting layer 250P may be formed of, e.g., SOG, and may be formed to be high such that the etched regions THa are filled and the first electrode 140c is covered.

Figure 8G:
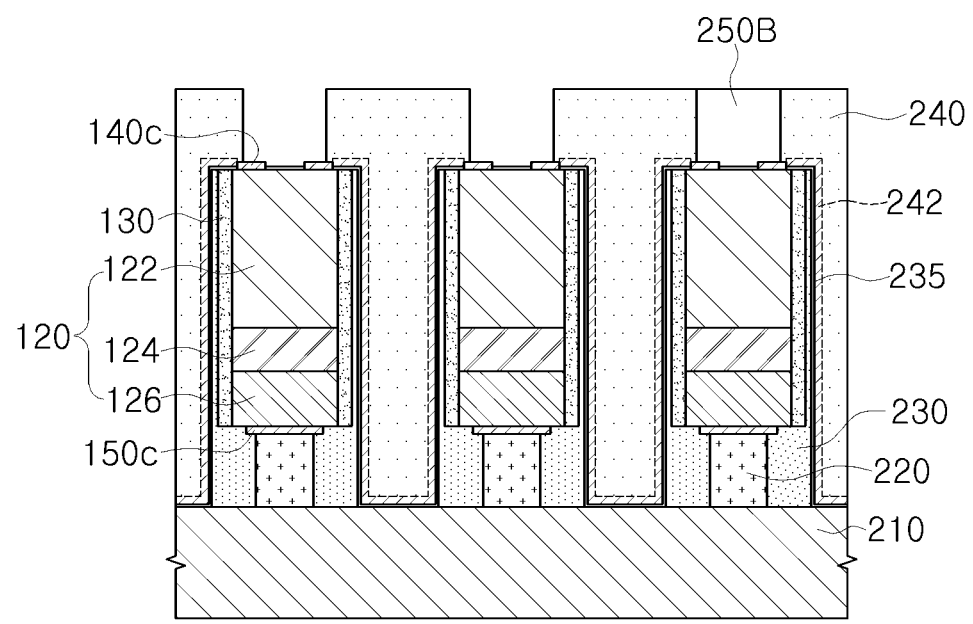

Referring to FIG. 8G, the preliminary wavelength converting layer 250P may be partially removed, and the partition wall 240 may be formed in a region from which the preliminary wavelength converting layer 250P has been removed.

The preliminary wavelength converting layer 250P may be removed from the region including regions between the light emitting structures 120 by the lithography process. The partition wall 240 may be formed in a region from which the preliminary wavelength converting layer 250P has been removed by electroplating. The partition wall 240 is formed to cover the electrode layer 242 in a region other than the first electrode 140c, and thus may be illustrated as including the electrode layer 242 as previously described with reference to FIG. 5. The partition wall 240 may be formed, e.g., using the electrode layer 242 as a seed layer, but is not limited thereto. The partition wall 240 may include, e.g., copper (Cu). An upper surface of the partition wall 240 may be flat by planarization process.

The preliminary wavelength converting layer 250P may be removed from a region in which the first and second wavelength conversion parts 250R and 250G are to be formed. The preliminary wavelength converting layer 250P may partially remain to form the third wavelength conversion part 250B.

Referring also to FIG. 5, the protective layer 260 may be formed after the first and second wavelength conversion parts 250R and 250G are formed. The first and second wavelength conversion parts 250R and 250G may be formed by filling the partitioning structure of the partition wall 240 with a wavelength converting material, e.g., a quantum dot, which is dispersed in a liquid binder resin, followed by curing. The binder resin may be formed of a material including, e.g., an acryl-based polymer. The first and second wavelength conversion parts 250R and 250G may include quantum dots capable of wavelength-converting blue light into red light and green light.

The protective layer 260 may then be formed on the wavelength conversion parts 250R, 250G and 250B. The protective layer 260 is prepared as a separate film and may be attached to an upper portion.

As set forth above, according to the example embodiments of the present disclosure, a semiconductor light emitting device and a display apparatus having improved reliability by optimizing a structure of a regrowth semiconductor layer covering a side surface of a light emitting structure may be provided. That is, a semiconductor light emitting device, according to example embodiments, includes a regrown semiconductor layer to cover an entire side surface of the light emitting structure, thereby repairing any potential crystallographic defects in the side surface of the light emitting structure. In particular, while patterning the light emitting structure in a desired shape by dry etching, the regrown semiconductor layer is formed to have crystallographically stable crystallographic surfaces, thereby minimizing surface leakage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
   a light emitting structure in a form of a rod, the light emitting structure including:
   a first conductivity-type semiconductor layer, the first conductivity-type semiconductor layer defining a first surface of the light emitting structure,
   an active layer,
   a second conductivity-type semiconductor layer, the second conductivity-type semiconductor layer defining a second surface of the light emitting structure opposite the first surface, and a side surface of the light emitting structure connecting the first and second surfaces and being perpendicular to the first and second surfaces;
   a regrowth semiconductor layer surrounding an entirety of the side surface of the light emitting structure, the regrowth semiconductor layer having a first thickness at a first position along a perimeter of the side surface and a second thickness, different from the first thickness, at a second position along the perimeter of the side surface, wherein the regrowth semiconductor layer comprises an undoped layer;
   a first electrode on the first surface of the light emitting structure and connected to the first conductivity-type semiconductor layer; and
   a second electrode on the second surface of the light emitting structure and connected to the second conductivity-type semiconductor layer,
   wherein the regrowth semiconductor layer contacts a side surface of the first conductivity-type semiconductor layer, a side surface of the active layer, and a side surface of the second conductivity-type semiconductor layer.

2. The semiconductor light emitting device as claimed in claim 1, wherein the side surface of the light emitting structure and an external side surface of the regrowth semiconductor layer have different shapes along a cross-section perpendicular to the side surface and the external side surface.

3. The semiconductor light emitting device as claimed in claim 2, wherein the side surface of the light emitting structure is circular in the cross-section, and the external side surface of the regrowth semiconductor layer is hexagonal in the cross-section.

4. The semiconductor light emitting device as claimed in claim 2, wherein the side surface of the light emitting structure is tetragonal in the cross-section, and the external side surface of the regrowth semiconductor layer is octagonal in the cross-section.

5. The semiconductor light emitting device as claimed in claim 1, wherein an external side surface of the regrowth semiconductor layer is formed of crystallographic planes.

6. The semiconductor light emitting device as claimed in claim 5, wherein the external side surface of the regrowth semiconductor layer is formed of equivalent crystallographic planes.

7. The semiconductor light emitting device as claimed in claim 1, wherein the first electrode is in contact with a lower surface of the regrowth semiconductor layer.

8. The semiconductor light emitting device as claimed in claim 7, wherein the second electrode is in contact with an upper surface of the regrowth semiconductor layer.

9. The semiconductor light emitting device as claimed in claim 1, wherein a thickness of the regrowth semiconductor layer is about 1 nm to about 100 nm.

10. The semiconductor light emitting device as claimed in claim 1, wherein a diameter of the light emitting structure is about 0.2 μm to about 100 μm.

11. The semiconductor light emitting device as claimed in claim 1, wherein an aspect ratio of the light emitting structure is about 2 to about 100.

12. A semiconductor light emitting device, comprising:
    a light emitting structure in a form of a rod, the light emitting structure including:
    a first conductivity-type semiconductor layer, the first conductivity-type semiconductor layer defining a first surface of the light emitting structure,
    an active layer,
    a second conductivity-type semiconductor layer, the second conductivity-type semiconductor layer defining a second surface of the light emitting structure opposite the first surface, and a side surface of the light emitting structure connecting the first and second surfaces;

a regrowth semiconductor layer surrounding an entirety of the side surface of the light emitting structure, the regrowth semiconductor layer having an external side surface formed of crystallographic planes, wherein the regrowth semiconductor layer comprises an undoped layer;

a first electrode on the first surface of the light emitting structure and connected to the first conductivity-type semiconductor layer; and a second electrode on the second surface of the light emitting structure and connected to the second conductivity-type semiconductor layer, wherein the side surface of the light emitting structure and the external side surface of the regrowth semiconductor layer have different shapes in a cross-section perpendicular to the side surface and the external side surface, wherein the regrowth semiconductor layer contacts a side surface of the first conductivity-type semiconductor layer, a side surface of the active layer, and a side surface of the second conductivity-type semiconductor layer.

13. The semiconductor light emitting device as claimed in claim 12, wherein the regrowth semiconductor layer has a non-constant thickness along a perimeter of the light emitting structure.

14. The semiconductor light emitting device as claimed in claim 12, wherein the external side surface of the regrowth semiconductor layer is formed of a single equivalent crystallographic plane or two equivalent crystallographic planes.

15. The semiconductor light emitting device as claimed in claim 12, wherein the side surface of the light emitting structure is not defined by a crystallographic plane.

16. The semiconductor light emitting device as claimed in claim 12, wherein the external side surface of the regrowth semiconductor layer and the side surface of the light emitting structure are perpendicular to the first and second surfaces.

17. A display apparatus, comprising:
first and second electrode parts in each of a plurality of pixel regions and spaced apart from each other; and
the semiconductor light emitting device as claimed in claim 1, the semiconductor light emitting device being between the first and second electrode parts.

18. A display apparatus, comprising:
a circuit board including driving circuits to drive pixel regions;
semiconductor light emitting devices as claimed in claim 12, the semiconductor light emitting devices being spaced apart from each other on the circuit board and defining the pixel regions;
wavelength conversion parts on first surfaces of the semiconductor light emitting devices; and
a partition wall surrounding side surfaces of the wavelength conversion parts and having a partitioning structure separating the wavelength conversion parts.

19. The display apparatus as claimed in claim 18, wherein the partition wall is connected to the first electrode and extends to be adjacent to an upper surface of the circuit board in a length direction of the light emitting structures.

20. The display apparatus as claimed in claim 18, further comprising a molding part between the partition wall and the semiconductor light emitting devices to surround the semiconductor light emitting devices.

* * * * *